(12) United States Patent
Lien et al.

(10) Patent No.: US 7,304,875 B1
(45) Date of Patent: *Dec. 4, 2007

(54) CONTENT ADDRESSABLE MEMORY (CAM) DEVICES THAT SUPPORT BACKGROUND BIST AND BISR OPERATIONS AND METHODS OF OPERATING SAME

(75) Inventors: Chuen Der Lien, Los Altos Hills, CA (US); Michael Miller, Saratoga, CA (US); Chau-Chin Wu, Cupertino, CA (US); Kee Park, San Jose, CA (US); Scott Yu-Fan Chu, San Jose, CA (US)

(73) Assignee: Integrated Device Technology. Inc., San Jose, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 11/184,414

(22) Filed: Jul. 19, 2005

Related U.S. Application Data

(63) Continuation-in-part of application No. 10/738,264, filed on Dec. 17, 2003, now Pat. No. 6,987,684.

(51) Int. Cl.
G11C 15/00 (2006.01)
(52) U.S. Cl. .................... 365/49; 365/201; 365/200
(58) Field of Classification Search ............. 365/49, 365/201, 200, 189.07; 714/733, 718; 711/108
See application file for complete search history.

(56) References Cited

U.S. PATENT DOCUMENTS

| | | | |
|---|---|---|---|
| 3,665,422 A | 5/1972 | McCoy et al. | 365/222 |
| 4,112,502 A | 9/1978 | Scheuneman | 364/900 |
| 4,747,080 A | 5/1988 | Yamada | 365/200 |
| 4,779,226 A | 10/1988 | Haraszti | |
| 4,791,606 A | 12/1988 | Threewitt et al. | |
| 4,903,268 A | 2/1990 | Hidaka et al. | |
| 4,958,352 A | 9/1990 | Noguchi et al. | |
| 4,991,136 A | 2/1991 | Mihara | |
| 5,046,046 A | 9/1991 | Sweha et al. | |
| 5,127,014 A | 6/1992 | Raynham | |
| 5,184,325 A | 2/1993 | Lipovski | 365/222 |
| 5,233,614 A | 8/1993 | Singh | |
| 5,278,839 A | 1/1994 | Matsumoto et al. | |
| 5,319,589 A | 6/1994 | Yamagata et al. | |
| 5,448,165 A | 9/1995 | Hodge et al. | |
| 5,450,424 A | 9/1995 | Okugaki et al. | |
| 5,455,834 A | 10/1995 | Chang et al. | |

(Continued)

OTHER PUBLICATIONS

Kalter et al., "A 50-ns 16-Mb DRAM with a 10-ns Data Rate and On-Chip ECC," IEEE Journal of Solid-State Circuits, vol. 25, No. 5, Oct. 1990, pp. 1118-1127.

*Primary Examiner*—David Lam
(74) *Attorney, Agent, or Firm*—Myers Bigel Sibley & Sajovec PA

(57) ABSTRACT

Search engine devices include a content addressable memory (CAM) core having a plurality of CAM array blocks therein and a control circuit. The control circuit, which is electrically coupled to the plurality of CAM array blocks, is configured to perform built-in self repair (BISR) of hard memory defects and/or compare logic defects in the plurality of CAM array blocks concurrently with operations to search entries in the plurality of CAM array blocks.

8 Claims, 8 Drawing Sheets

U.S. PATENT DOCUMENTS

| | | | |
|---|---|---|---|
| 5,469,450 A | 11/1995 | Cho et al. | |
| 5,491,703 A | 2/1996 | Barnaby et al. | 371/40.1 |
| 5,561,429 A | 10/1996 | Halberstam et al. | |
| 5,570,377 A | 10/1996 | Merino Gonzalez et al. | |
| 5,572,460 A | 11/1996 | Lien | |
| 5,604,753 A | 2/1997 | Bauer et al. | |
| 5,629,950 A | 5/1997 | Godiwala et al. | |
| 5,642,320 A | 6/1997 | Jang | 365/222 |
| 5,644,583 A | 7/1997 | Garcia et al. | |
| 5,682,394 A | 10/1997 | Blake et al. | |
| 5,699,369 A | 12/1997 | Guha | |
| 5,724,296 A | 3/1998 | Jang | |
| 5,727,003 A | 3/1998 | Zook | |
| 5,761,222 A | 6/1998 | Baldi | |
| 5,796,671 A | 8/1998 | Wahlstrom | |
| 5,796,758 A | 8/1998 | Levitan | 371/49.1 |
| 5,872,802 A | 2/1999 | Knaack et al. | 371/49.1 |
| 5,920,515 A | 7/1999 | Shaik et al. | |
| 5,961,653 A | 10/1999 | Kalter et al. | |
| 6,009,548 A | 12/1999 | Chen et al. | |
| 6,032,214 A | 2/2000 | Farmwald et al. | |
| 6,058,500 A | 5/2000 | DesJardins et al. | |
| 6,065,134 A | 5/2000 | Bair et al. | |
| 6,067,656 A | 5/2000 | Rusu et al. | 714/768 |
| 6,091,649 A | 7/2000 | Choi | |
| 6,134,631 A | 10/2000 | Jennings, III | |
| 6,137,707 A | 10/2000 | Srinivasan et al. | |
| 6,141,779 A | 10/2000 | Hill et al. | |
| 6,151,247 A | 11/2000 | Estakhri et al. | |
| 6,154,384 A | 11/2000 | Nataraj et al. | 365/49 |
| 6,188,629 B1 | 2/2001 | Kaplinsky | |
| 6,199,140 B1 | 3/2001 | Srinivasan et al. | |
| 6,216,246 B1 | 4/2001 | Shau | |
| 6,219,815 B1 | 4/2001 | DesJardins et al. | |
| 6,233,717 B1 | 5/2001 | Choi | |
| 6,243,281 B1 | 6/2001 | Pereira | 365/49 |
| 6,249,475 B1 | 6/2001 | Atwell et al. | |
| 6,259,637 B1 | 7/2001 | Wood et al. | |
| 6,272,056 B1 | 8/2001 | Ooishi | |
| 6,289,471 B1 | 9/2001 | Gordon | |
| 6,324,087 B1 | 11/2001 | Pereira | 365/49 |
| 6,343,366 B1 | 1/2002 | Okitaka | |
| 6,362,990 B1 | 3/2002 | Gibson et al. | 365/49 |
| 6,374,325 B1 | 4/2002 | Simpson et al. | |
| 6,381,191 B2 | 4/2002 | Ooishi | |
| 6,388,929 B1 | 5/2002 | Shimano et al. | |
| 6,396,760 B1 | 5/2002 | Behera et al. | |
| 6,397,290 B1 | 5/2002 | Williams et al. | |
| 6,408,417 B1 | 6/2002 | Moudgal et al. | |
| 6,421,265 B1 | 7/2002 | Lien et al. | 365/49 |
| 6,421,286 B1 | 7/2002 | Ohtani et al. | |
| 6,430,073 B1 | 8/2002 | Batson et al. | 365/49 |
| 6,434,033 B1 | 8/2002 | Chien | |
| 6,438,044 B2 | 8/2002 | Fukuda | |
| 6,438,046 B1 | 8/2002 | Agrawal | |
| 6,445,628 B1 | 9/2002 | Pereira et al. | |
| 6,477,615 B1 | 11/2002 | Tanaka | |
| 6,519,202 B1 | 2/2003 | Shubat et al. | |
| 6,538,911 B1 | 3/2003 | Allan et al. | 365/49 |
| 6,542,391 B2 | 4/2003 | Pereira et al. | 365/49 |
| 6,553,510 B1 | 4/2003 | Pekny | |
| 6,556,490 B2 | 4/2003 | Shubat et al. | |
| 6,560,156 B2 | 5/2003 | Lien et al. | 365/222 |
| 6,563,754 B1 | 5/2003 | Lien et al. | |
| 6,597,595 B1 | 7/2003 | Ichiriu et al. | 365/49 |
| 6,603,691 B2 | 8/2003 | Yoo et al. | |
| 6,618,281 B1 | 9/2003 | Gordon | 365/49 |
| 6,631,086 B1 | 10/2003 | Bill et al. | |
| 6,646,933 B1 | 11/2003 | Shubat et al. | |
| 6,661,687 B1 | 12/2003 | Lien et al. | |
| 6,690,595 B1 | 2/2004 | Srinivasan | 365/49 |
| 6,700,810 B1 | 3/2004 | Ichiriu et al. | 365/49 |
| 6,700,827 B2 | 3/2004 | Lien et al. | |
| 6,707,693 B1 | 3/2004 | Ichiriu et al. | |
| 6,711,703 B2 | 3/2004 | MacLaren et al. | |
| 6,714,466 B2 * | 3/2004 | Park et al. | 365/200 |
| 6,715,116 B2 | 3/2004 | Lester et al. | |
| 6,728,124 B1 | 4/2004 | Ichiriu et al. | |
| 6,741,253 B2 | 5/2004 | Radke et al. | |
| 6,754,093 B2 | 6/2004 | Lien | |
| 6,760,881 B2 | 7/2004 | Batson et al. | |
| 6,771,549 B1 * | 8/2004 | Konuk et al. | 365/200 |
| 6,775,168 B1 | 8/2004 | Park et al. | |
| 6,845,472 B2 | 1/2005 | Walker et al. | |
| 6,870,749 B1 | 3/2005 | Park et al. | |
| 6,879,504 B1 * | 4/2005 | Lien et al. | 365/49 |
| 6,888,732 B2 | 5/2005 | Hu | |
| 6,920,525 B2 * | 7/2005 | Chadwick et al. | 711/108 |
| 6,970,971 B1 * | 11/2005 | Warkhede et al. | 711/108 |
| 2002/0067632 A1 | 6/2002 | Batson et al. | |
| 2002/0075714 A1 | 6/2002 | Pereira et al. | 365/49 |
| 2002/0159320 A1 | 10/2002 | Lien et al. | |
| 2003/0007408 A1 | 1/2003 | Lien et al. | 365/222 |
| 2003/0074630 A1 | 4/2003 | Batson et al | 714/805 |
| 2003/0081464 A1 | 5/2003 | Vlasenko | 365/200 |

* cited by examiner

CONTENT ADDRESSABLE MEMORY (CAM) DEVICES THAT SUPPORT BACKGROUND BIST AND BISR OPERATIONS AND METHODS OF OPERATING SAME

REFERENCE TO RELATED APPLICATION

This application is a continuation-in-part (CIP) of U.S. application Ser. No. 10/738,264, filed Dec. 17, 2003, now U.S. Pat. No. 6,987,684, the disclosure of which is hereby incorporated herein be reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., assigned to the present assignee, the disclosures of which are hereby incorporated herein by reference.

CAM cells are frequently configured as binary CAM cells that store only data bits (as "1" or "0" logic values) or as ternary (or quaternary) CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of logical width N, then a compare operation will yield one or more match conditions whenever all the unmasked data bits of an entry in the ternary CAM array are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}. As will be understood by those skilled in the art, conventional "quaternary" CAM cells, which have four valid combinations of states: ((data=0, mask=active), (data=1, mask=active), (data=0, mask=inactive), (data=1, mask=inactive)), are frequently treated as "ternary" CAM cells because two of the four states represent an equivalent active mask condition. In contrast, ternary CAM cells may include CAM cells having two bits of data that are configurable in only three valid combinations: ((0,1)=0, (1,0)=1, (0,0)=mask and (1,1)=invalid). Both types of cells will be referred to herein as ternary CAM cells.

CAM devices may also use coding techniques to detect and correct one-bit soft errors in entries within a CAM array. One such CAM device that uses a parity comparator to detect errors is described in U.S. Pat. No. 6,067,656 to Rusu et al., entitled "Method and Apparatus for Detecting Soft Errors in Content Addressable Memory Arrays." Another such CAM device that uses dynamic content addressable memory (DCAM) cells is disclosed in U.S. Pat. No. 6,430,073 to Batson et al., entitled "DRAM CAM Cell with Hidden Refresh." In particular, the '073 patent discloses a technique for performing hidden refresh of dynamic CAM entries using non-destructive read operations that may be performed during match line (ML) precharge operations. Upon reading, the entries may be checked for errors and possibly corrected before undergoing a refresh write operation.

U.S. Pat. No. 6,597,595 to Ichiriu et al. discloses a CAM device that performs error detection signaling operations. These error detection signaling operations are described as background error checking operations that consume little if any compare bandwidth. This is because any operation to read an entry from a CAM array for error checking purposes may be performed concurrently with the performance of compare operations on the same CAM array. As illustrated by FIG. 1, which is a reproduction of FIG. 10 from the '595 patent, a CAM array 321 is provided with multiple storage blocks 325 (shown as Blocks 1-K). In response to a read operation from a check address 155 (CADDR) within the CAM array 321, data, parity and validity values (shown as $DPV_1$ through $DPV_K$) are passed through a read/write circuit 322 into a parity-based error detector 323. This parity-based error detector is illustrated as including a plurality of error detection circuits 329. This check address 155 may be supplied by a check address generator (see, e.g., Block 124 in FIG. 2 of the '595 patent). Each of these error detection circuits 329 performs a parity-based error detection operation on a corresponding data word and generates a respective block parity error signal 330 (BLOCK ERROR). These block parity error signals 330 may be logically ORed by an OR gate 331 into a global parity error signal 335 (GLOBAL ERROR). The global parity error signal 335 is provided as a load input to an error address register 337 and as a set input to an S-R flip-flop 339. Whenever a block parity error is signaled by any of the error detection circuits 329, the resulting global parity error signal 335 is used to load the check address 155 into the error address register 337 and to set the S-R flip-flop 339. The S-R flip-flop 339 can be reset by driving a reset signal 153 (RESET) high. The error address register 337 is also illustrated as receiving a read signal 151 (READ) and a clock signal 104 (CLK). The error address register 337 and the S-R flip-flop 339 are configured to output an error address 131 (ERROR ADDR) and an error flag (EFLAG) 132. The error detector 323 may also include circuitry (not shown) to store a value indicative of which of the error detection circuits has signaled a block error. This value, referred to as a block identifier, may be stored along with the check address 155 in the error address register 337. The block identifier may then be output from the error address register 337 (as part of the error address) to thereby enable a host or other circuitry within the CAM device to identify the block or blocks within the CAM array 321 that produced the error indication.

Referring now to FIG. 2, which is a reproduction of FIG. 16 from the '595 patent, an alternative error detector 501 is illustrated. This error detector 501 is an error detector/corrector that uses a more complex error correction code instead of parity bit(s). At the top of FIG. 2, a CAM entry is illustrated as including a data word 503, shown as data D[M-1,0], an error correction code word 505 (e.g., Hamming code word) and a validity bit 506 (V). This CAM entry resides at the error address 536 (EADDR) specified by an ECC address generator 535. This error address 536 may be provided to an address selector (see, e.g., Block 125 in FIG. 2 of the '595 patent). As will be understood by those skilled in the art, in order to enable one bit error correction within a data word having a length of M bits, the error correction code word 505 should have a length equal to "c" bits, where the length "c" meets the following relationship: $2^c \geq M+c+1 \geq 2^{c-1}$. In response to a read operation, the data word 503 and error correction code word 505 are provided to a syndrome generator 507, which generates a syndrome 508 (i.e., parity check vector). The bits of the syndrome 508 are logically ORed using an OR gate 511 to generate a result signal that indicates whether an error is present in the CAM entry. This result signal is provided to an input of a AND gate 513, which also receives the validity bit signal 506. If the CAM entry is valid (i.e., V=1), then an error signal 514 (ERROR) may be generated at the output of the AND gate 513 whenever the result signal indicates the presence of an error. An error correction circuit 509 is also provided. The error correction circuit 509 receives the data word 503 and syndrome 508. If the error represents a single bit error that can be corrected, then the error correction circuit 509 generates a C-bit signal 512 (C-BIT), which indicates whether a correction has taken place, and a corrected CAM word 510 (data word and error correction code word). At the end of each error detection operation, the error address 536 (EADDR), corrected CAM word 510 (CDATA), error signal 514 (E) and C-bit signal 512 (C) are stored within an error address register 517, which is responsive to a clock signal 104. The error signals 514 and error addresses 536 that are stored within the error address register 517 may be used to generate an error flag 532 (EFLAG) and error address 531 (EADDR), which may be used to support background self-invalidation operations (see, e.g., FIG. 14 of the '595 patent). A write data multiplexer 540, which is responsive to a path select signal 541, is also provided so that a corrected CAM word (CDATA$_0$-CDATA$_{X-1}$) may be written back into a CAM array at an address specified by the corresponding error address (EADDR$_0$-EADDR$_{X-1}$).

Notwithstanding the disclosure of the '595 patent, the performance of a background operation to read an entry from a CAM array while a foreground compare operation is being performed concurrently on the same CAM array may impact the reliability of the compare operation. This is because the performance of a read operation on a row of CAM cells within a CAM array may operate to "stress" the memory elements within the row of CAM cells and cause the logic levels of signals within the memory elements to fluctuate. Such fluctuations can represent a significant disturbances to the outputs of the memory elements, particularly if the CAM cells are powered at low voltage levels (e.g., Vdd=1 Volt), and may result in erroneous compare operations. Accordingly, it may be more advantageous to perform read operations for error checking purposes as foreground operations that consume at least some degree of compare bandwidth.

Unfortunately, if the read operations used for error checking purposes in the error detector/corrector 501 of FIG. 2 are performed as foreground operations, then substantial compare bandwidth will likely be consumed as the ECC address generator 535 sequentially steps through the address of each CAM entry within an entire CAM core looking for errors to be corrected. To remedy this performance limitation associated with the error detector/corrector 501 of FIG. 2, a duplicate error detector/corrector 501 could be provided for each CAM storage block in the CAM core. However, unlike parity-based error detectors, which can be made relatively small, the use of an error detector/corrector 501 with each CAM storage block can be expected to consume a substantial amount of layout area and considerably increase power consumption requirements.

SUMMARY OF THE INVENTION

Search engine devices according to embodiments of the present invention include a content addressable memory (CAM) core having a plurality of CAM array blocks therein and a control circuit that is electrically coupled to the CAM core. The control circuit may include, among other things, an instruction FIFO, instruction loading and execution logic and check bit generation and error correction logic. Alternatively, the instruction loading and execution logic may perform instruction pipelining operations that eliminate the need for an instruction FIFO, or the instruction loading and execution logic may be configured to support no-op cycle generation even when the instruction FIFO is partially full. The control circuit is configured to support internal error detection and correction operations that can operate without significant impact on the compare bandwidth of the search engine device, even when operations to read entries from the CAM core are performed as foreground operations that may block concurrent search operations. The control circuit may perform the error detection and correction operations by issuing multiple read instructions. These instructions include a first instruction (e.g., error check instruction) to read at least a first entry within the CAM core for the purpose of error detection and then, in response to detecting the first entry as erroneous, issuing a second instruction to read the first entry from the CAM core.

In particular, the first read operation may be performed as a "high bandwidth" error checking operation that causes many CAM entries to be read in parallel from a plurality of CAM array blocks and checked in parallel for parity errors. The second read operation (or sequence of read operations)

is a much more selective operation because it is directed at only those entries that have already been detected as erroneous. In many instances, the second read operation will not need to be performed because many of the first "high bandwidth" read operations will result in the detection of no errors in a group of CAM entries.

To respond to the second read operation, an erroneous entry is transferred to the error correction logic within the control circuit. The error correction logic may operate to detect the presence of one or more errors (e.g, 2-4 errors) within the entry and, if possible, correct the entry. In a typical embodiment, the error correction logic may be configured to detect as many as four errors within an entry and correct one error within the entry. If two or more errors are present and cannot be corrected, then the search engine device may notify a command host of the erroneous entry and the corresponding entry may be invalidated within the CAM core. This notification operation may also include notification of all entries detected as erroneous, even if they are subject to correction within the search engine device.

The ability to detect a high number of errors within an entry and also correct the entry without requiring a check word having an excessive number of check bits is achieved using a modified Hamming code word that combines parity and non-parity check bits. In particular, the Hamming code word may consist of P parity bits and H non-parity bits, where H is a positive integer greater than one and P is a positive even integer greater than two and the following relationship is met: $2^{(H+1/2P)} \geq N+H+\frac{1}{2}P+1 \geq 2^{(H+1/2P-1)}$, where N is a length of the data word (including validity bit, etc.).

Further embodiments of the present invention include methods of operating a CAM-based search engine device. These methods include issuing a parity check instruction and a multi-block row address to a CAM core within a search engine device. This instruction may be issued in response to detecting a presence of a no-op cycle within an instruction pipeline within the search engine device. In response to this instruction, a plurality of entries may be read in parallel from a plurality of CAM array blocks within the CAM core. A local parity check operation is then performed on the plurality of entries in order to detect a presence of at least a first entry in the plurality of entries that is erroneous. This operation may also include the generation of an error indication word at a read data port of the CAM core. The error indication word may be encoded so that each bit of the word indicates whether or not a corresponding one of the plurality of entries is erroneous.

In response to this detection, an internally generated instruction is issued to read the first entry from the CAM core. This instruction causes a "second" reading of the first entry from the CAM core into error correction logic within the search engine device. The first entry is then corrected within the search engine device using an error correction code that is held by the first entry. Once corrected, the first entry is rewritten into the CAM core. The latter operations are repeated until all entries that have been detected as erroneous are corrected. Once all erroneous entries have been corrected, the multi-block row address is incremented and another parity-check instruction is issued to the CAM core to repeat the error checking and correcting operations.

Still further embodiments of the invention include an integrated search engine device containing a content addressable memory (CAM) core. This CAM core includes control and other core logic and a plurality of CAM array blocks therein. A control circuit, which includes the control logic, is electrically coupled to the plurality of CAM array blocks.

The control circuit is configured to perform built-in self repair of hard memory defects and/or compare logic defects in the plurality of CAM array blocks concurrently with operations to search entries in the plurality of CAM array blocks. In particular, the control circuit may be configured to repair a hard memory error and/or a compare logic defect in a first one of the plurality of CAM array blocks concurrently with searching entries associated with the first one of the plurality of CAM array blocks. These entries associated with the first one of the plurality of CAM array blocks may be entries copied from the first one of the plurality of CAM array blocks to a temporary CAM array block. The repair of a hard memory error or a compare logic defect may include replacing a defective row or column of CAM cells in the first one of the plurality of CAM array blocks. These embodiments of the invention may also result in a search engine device configured to support built-in self test (BIST) operations and built-in self repair (BISR) of hard memory errors as background operations that are performed concurrently with foreground search operations.

DESCRIPTION OF PREFERRED EMBODIMENTS

Figure 1:
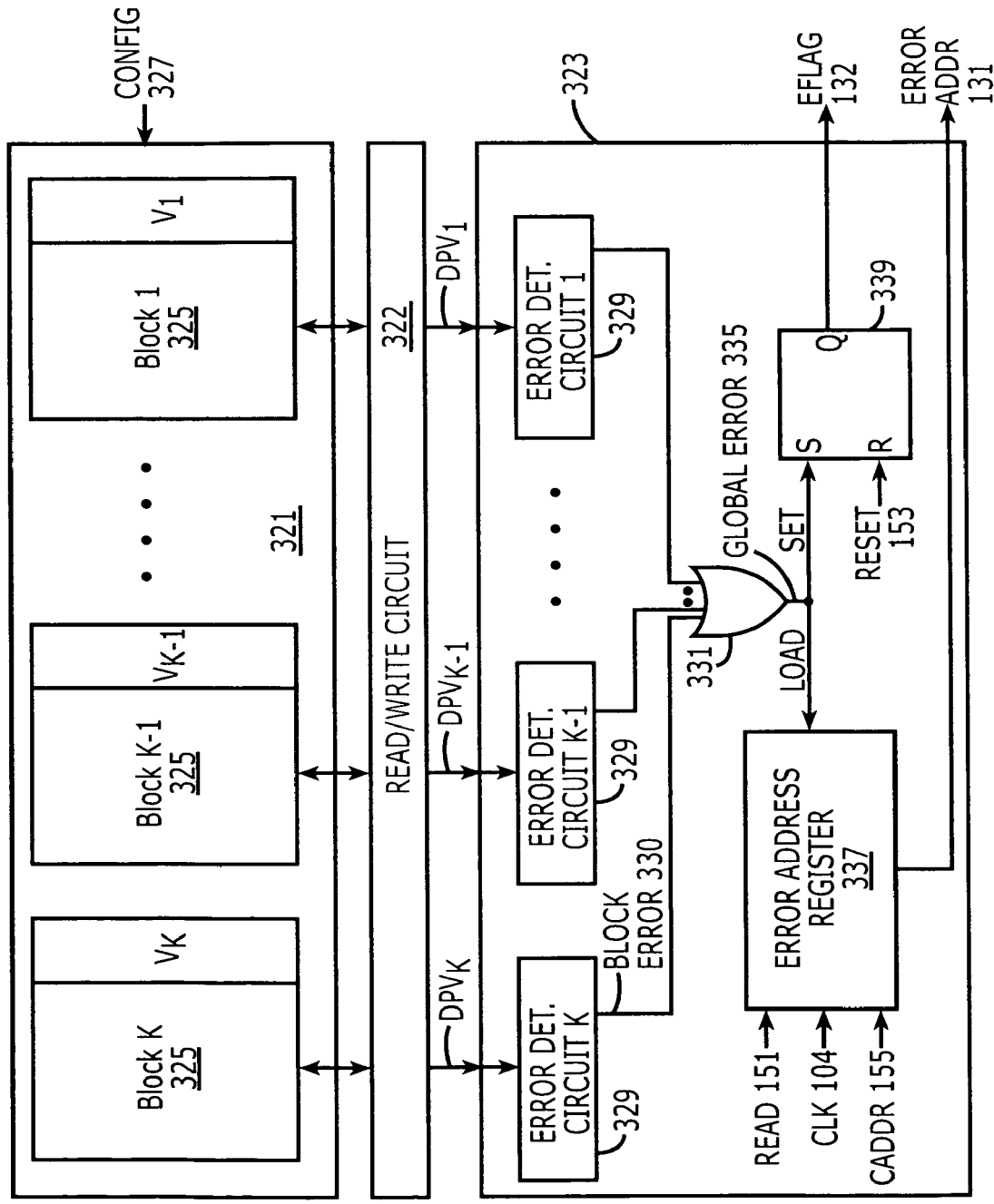
FIG. 1 is a block diagram of a conventional content addressable memory (CAM) device having parity-based error detection circuits therein.
Figure 2:
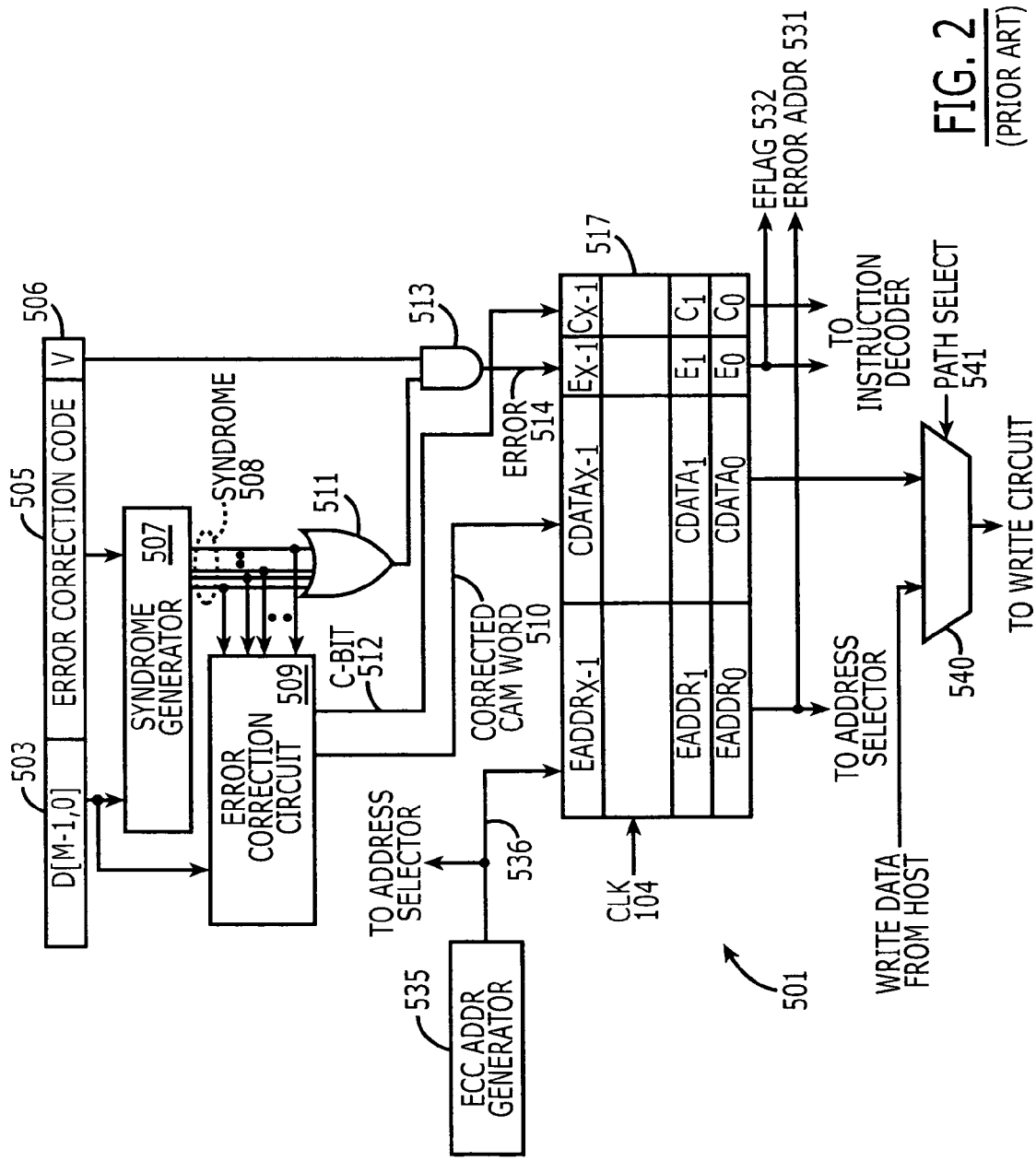
FIG. 2 is a block diagram of a conventional content addressable memory (CAM) device having an error correction circuit therein.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figure 3:
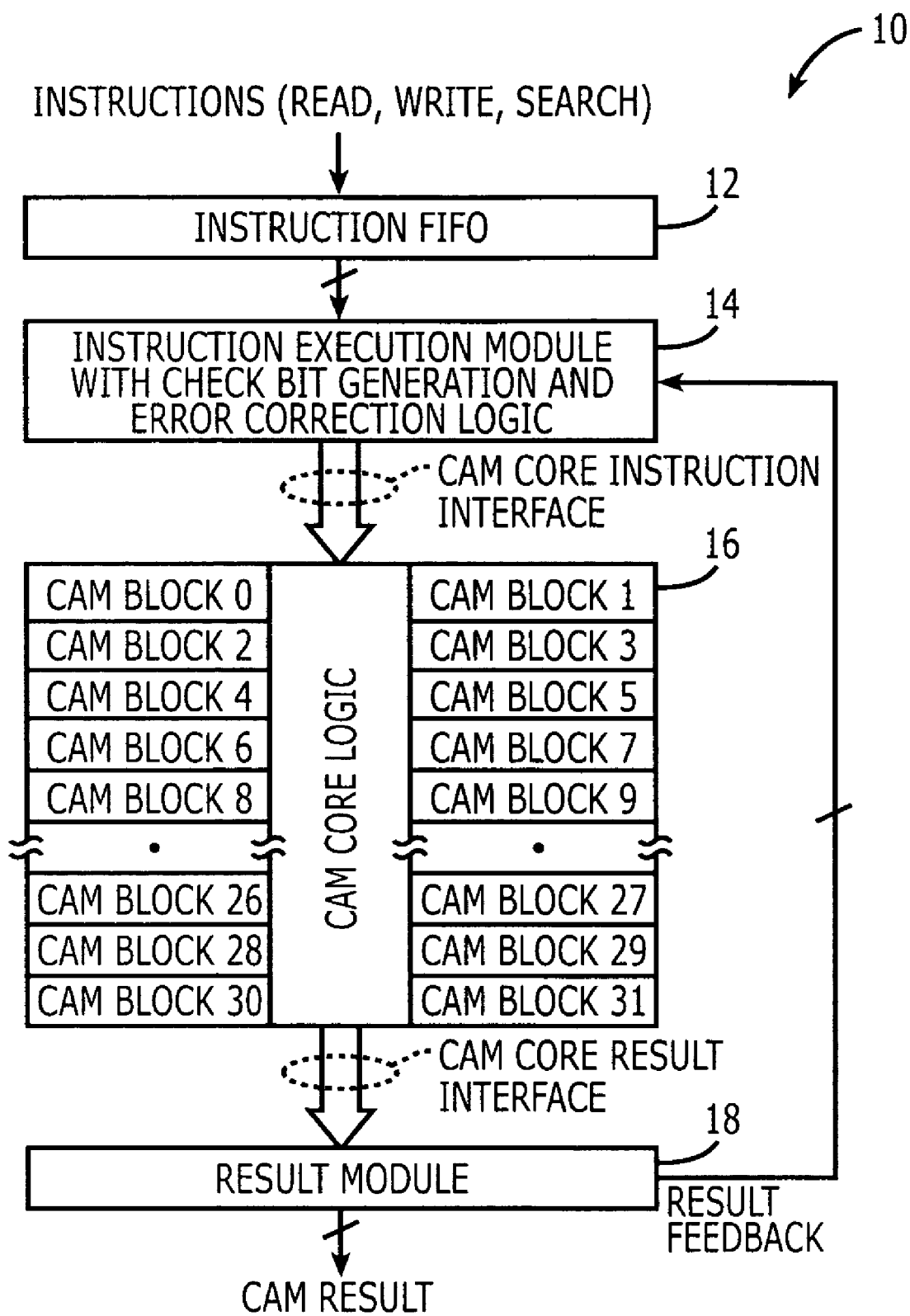
FIG. 3 is a block diagram of a search engine device according to embodiments of the present invention.
Figure 4A:
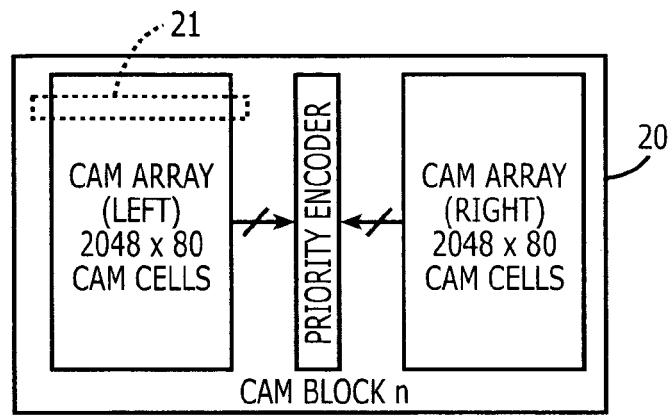
FIG. 4A illustrates a CAM array blocking having a pair of CAM arrays therein, according to embodiments of the present invention.

FIG. 3 is a block diagram of a search engine device 10 according to a first embodiment of the present invention. This search engine device 10 is illustrated as including an instruction buffer 12, which may be configured as a first-in first-out (FIFO) memory device, however, other conventional logic may be used to incorporate received instructions into an instruction pipeline. The instruction buffer 12 is configured to receive instructions (e.g., read, write and search) that are compatible with operations performed by a content addressable memory (CAM) core 16. This CAM core 16 is illustrated as including 32 CAM array blocks and CAM core logic. As illustrated by FIG. 4A, each CAM array block 20 may include a pair of CAM arrays that are separated by a priority encoder. These CAM arrays are shown as having a capacity of 2048×80 bits for a CAM core having a capacity of 10 Meg. Each 80 bit entry 21 may be configured as illustrated by FIG. 4B.

The instructions provided to the instruction buffer 12 may be generated by a command host (not shown), such as a network processing unit (NPU), and received by an instruction mapped interface (not shown) of the search engine device 10. The search engine device 10 is also illustrated as including an instruction execution module 14 having instruction loading and execution logic therein. This instruction execution module 14 performs operations of a finite state machine (FSM), including, among other things, instruction scheduling and arbitration. As illustrated, the instruction execution module 14 may issue instructions to the CAM core 16 via an instruction interface. In response, the CAM core 16 performs operations and generates results that are provided to a result module 18 via a CAM core result interface. Some of these results may be processed by the result module 18 and passed to results mailboxes (not shown), for subsequent reporting to the command host, or passed to a results bus for immediate reporting. Other results may be fed back to the instruction execution module 14, as illustrated. A detailed description of operations performed by the instruction buffer 12, instruction execution module 14 and result module 18 is also provided in commonly assigned U.S. application Ser. No. 10/721,036, filed Nov. 21, 2003, the disclosure of which is hereby incorporated herein by reference. These devices 12, 14, 18 and the CAM core logic, which are electrically coupled to the CAM core 16 and the CAM array blocks, collectively define a control circuit as described more fully herein.

The instruction execution module 14 is illustrated as including check bit generation and error correction logic therein. In some embodiments of the present invention, the check bit generation logic may be configured to generate check bits that support error detection and error correction operations, which may be performed independently inside and outside the CAM core 16. The check bit generation logic may be configured to generate a modified Hamming code word for each entry that is written into the CAM core 16. This modified Hamming code word may be attached to each entry when it is written into the CAM core 16 or stored in a separate check bit memory (not shown) that maps to each entry within the CAM core 16. The use of separate check bit memory is described more fully in commonly assigned U.S. application Ser. No. 10/619,635, filed Jul. 15, 2003. The modified Hamming code supports limited 4-bit error detection and 1-bit error correction operations. In particular, a maximum of four errors may be detected so long as the four errors are distributed over the Xe, Xo, Ye and Yo bits of an entry, as described below.

Figure 4B:
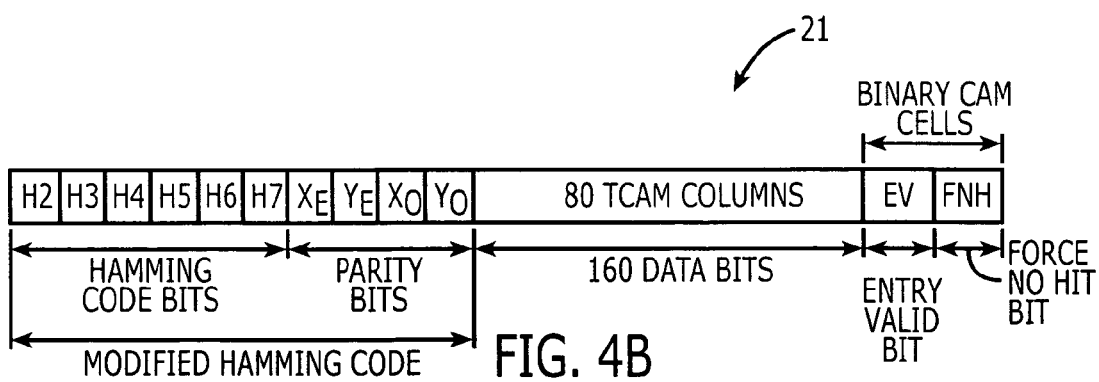
FIG. 4B illustrates the arrangement of modified Hamming code bits and data bits within a CAM entry, according to embodiments of the present invention.

The 80-bit wide CAM entry 21 of FIG. 4B is illustrated as including 80 ternary CAM (TCAM) cells, which support 160 bits of data in the form of 80 X-bits and 80 Y-bits. These TCAM cells may be configured as lateral XY CAM cells that are each coupled to two pairs of bit lines and one pair of data lines. The layout, electrical configuration and operation of such XY CAM cells are more fully described in commonly assigned U.S. application Ser. No. 10/609,756, filed Jun. 20, 2003, and U.S. application Ser. No. 10/386,400, filed Mar. 11, 2003, the disclosures of which are hereby incorporated herein by reference.

The CAM entry 21 is also illustrated as including an entry valid bit (EV) and a force no-hit bit (FNH). The entry valid bit (EV) is a searchable bit that may be set low to represent an invalid entry or set high to represent a valid entry. The force no-hit bit (FNH) may be set to force a corresponding entry to register a miss condition whenever a search operation is performed on the entry. An active FNH bit will also operate to cause all lower priority matching entries within the same CAM segment, if any, to register a miss condition(s). The entry valid bit (EV) and force no-hit bit (FNH) may be stored within binary CAM cells. Both of these bits can be used in the parity bit calculation, which means any operations to change these bits within an entry in the CAM core 16 may need to be accompanied by or followed by operations to correct the check bit information in the entry. Accordingly, if an EV bit is switched from a valid value to an invalid value to thereby age out a corresponding entry during CAM aging operations, for example, the check bits associated with the entry will also need to be updated. This will prevent a formerly aged out entry from subsequently being detected as erroneous and then corrected (i.e., reborn) by switching back the value of the EV bit. This correction of the check bit information when switching the EV bit to an invalid state can be achieved by writing a default entry with generic data and FNH values (e.g., all 0's), an invalid EV bit and check bits that are properly determined for these values. Operations to perform aging on CAM core entries is more fully illustrated and described in U.S. application Ser. No. 10/714,680, filed Nov. 14, 2003, the disclosure of which is hereby incorporated herein by reference.

The entry 21 of FIG. 4B is also illustrated as including ten (10) check bits that constitute a modified Hamming code word. These ten check bits include six standard Hamming code bits, shown as H2-H7, and four parity bits, shown as Xe, Ye, Xo and Yo, where "e" and "o" represent "even" and "odd", respectively. The 160 data bits within the entry 21 include 40 even X-bits (X0, X2, X4, . . . , and X78), 40 even Y-bits (Y0, Y2, Y4, . . . , and Y78), 40 odd X-bits (X1, X3, X5, . . . , and X79) and 40 odd Y-bits (Y1, Y3, Y5, . . . , and Y79).

The six Hamming code bits H2-H7 and four parity bits (Xe, Ye, Xo and Yo) may be generated within the check bit generation logic using circuitry that is configured to perform the following boolean operations:

$$H2=XOR(X[0,1,4\text{-}7,10,11,14,15,18\text{-}21,24\text{-}27,30,31,\\34,35,38\text{-}41,44\text{-}47,50,51,54,55,58\text{-}61,64\text{-}67,70,\\71,74,75,78,79],Y[0,1,4\text{-}7,10,11,14,15,18\text{-}21,24\text{-}\\27,30,31,34,35,38\text{-}41,44\text{-}47,50,51,54,55,58\text{-}61,\\64\text{-}67,70,71,74,75,78,79],FNH];$$

$H3=XOR(X[2-5,8-11,16-19,22-25,28-31,36-39,42-45, 48-51,56-59,62-65,68-71,76-79],Y[2-5,8-11,16-19,22-25,28-31,36-39,42-45,48-51,56-59,62-65, 68-71,76-79],EV);$ $H4=XOR(X[0-5,12-25,32-45,52-65,72-79],Y[0-5,12-25,32-45,52-65,72-79]);$ $H5=XOR(X[6-19,26-39,46-59,66-79],Y[6-19,26-39, 46-59,66-79]);$ $H6=XOR(X[20-39,60-79],Y[20-39,60-79]);$ $H7=XOR(X[40-79],Y[40-79]);$ $Xe=XOR(H4,X[0,2,4,6,8,10,12,\ldots,78],FNH);$ $Ye=XOR(H5,Y[0,2,4,6,8,10,12,\ldots,78]);$ $Xo=XOR(H2,H6,X[1,3,5,7,9,11,13,\ldots,79],EV);$ and $Yo=XOR(H3,H7,Y[1,3,5,7,9,11,13,\ldots,79]).$ A more detailed explanation of the characteristics and layout of the entry 21 within a segmented CAM array block is provided in U.S. application Ser. No. 10/701,048, filed Nov. 4, 2003.

Figure 5A:
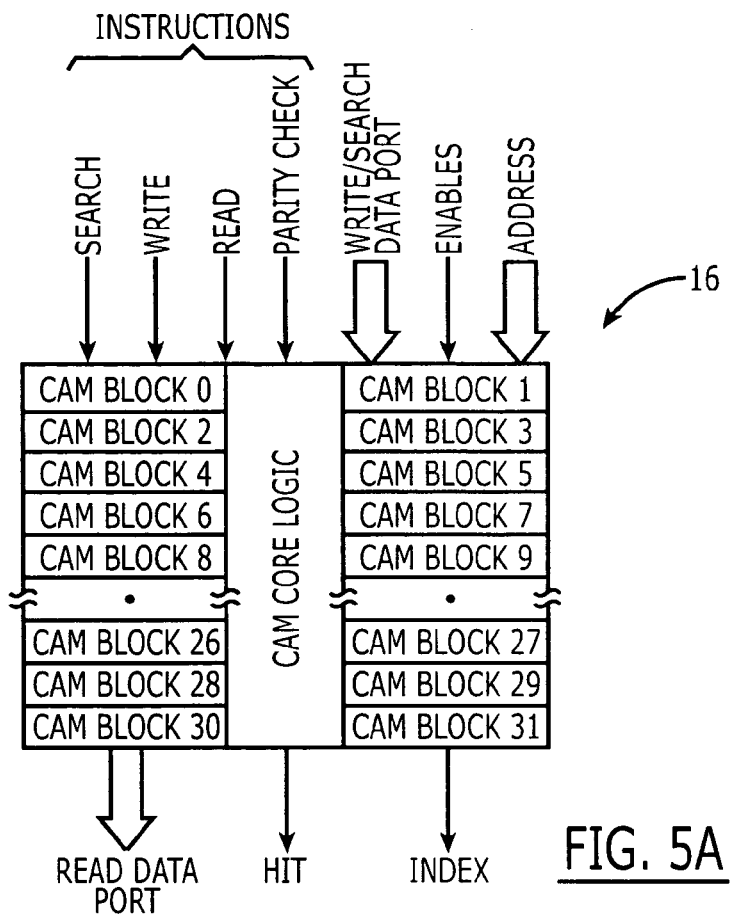
FIG. 5A is a block diagram of a CAM core according to embodiments of the present invention.

Communication to and from the CAM core 16 is made by the CAM core instruction and result interfaces. As illustrated by FIG. 5A, the CAM core instruction interface is configured to support communication of various instructions to the CAM core 16. These instructions are illustrated as search, write, read and parity check. Other instructions (not shown) may also be provided (e.g., learn, search and learn (SNL), clear valid, etc.). The incoming data port to the CAM core is accompanied by an address port, which may pass a write address (e.g., block and row addresses) to the CAM core during write operations. The CAM core 16 is also responsive to various enable signals.

The CAM core result interface is configured to generate one or more hit signals, which indicate the presence of matching entries within the CAM core 16 during search operations, and index data that identifies addresses of matching entries. The result interface is also configured with a read data port, as shown. As described more fully hereinbelow, this read data port may be used as a multi-function port that is active during parity check operations.

Figure 5B:
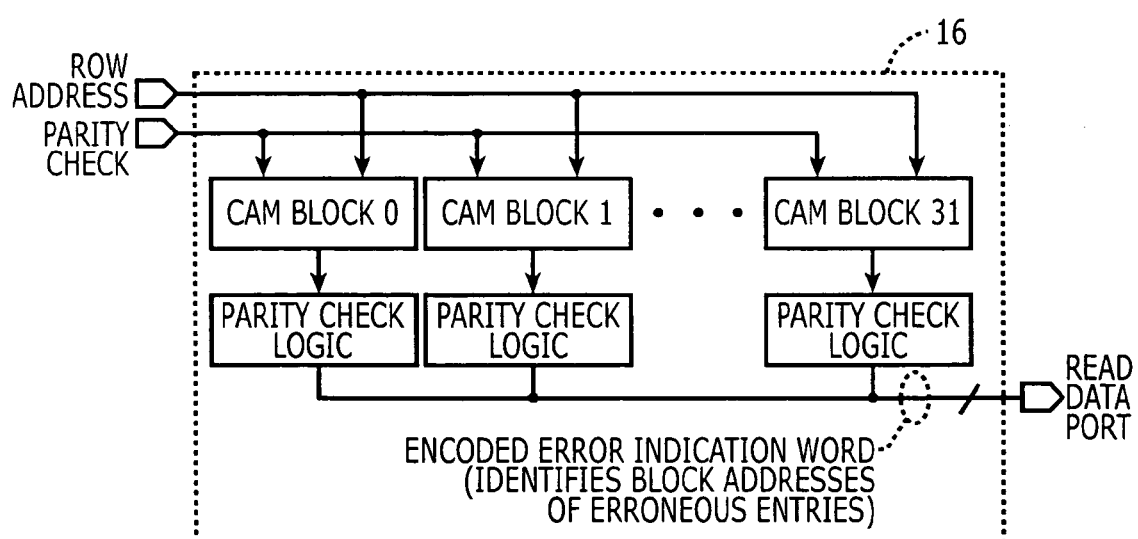
FIG. 5B is a block diagram of a CAM core having error detection logic therein, according to embodiments of the present invention.

As illustrated by FIG. 5B, the CAM core logic within the CAM core 16 of FIG. 5A combines parity check logic circuits that are associated with each CAM array block. In response to a parity/error check instruction and multi-block row address issued by the instruction execution module 14, a read operation is performed in parallel from the CAM array blocks. If the CAM core 16 is configured in a ¹⁄₁ parity check mode, then this read operation will be performed in parallel from all of the 32 blocks. In contrast, programming the CAM core 16 to support a ½ or ¼ parity check mode will cause the parity check read operation to be performed in parallel from 16 or 8 of the 32 CAM array blocks, respectively. For purposes of discussion herein, only the ¹⁄₁ parity check mode will be considered.

In response to the parallel read operation, two entries 21 (left and right) from each CAM array block will be read into the parity check logic circuits associated with each CAM array block. The parity check logic circuits will generate a parity result (PARITY RESULT) upon receipt of each entry 21. The parity result may be determined using logic that performs the following boolean operations:

$PARITY\ RESULT=OR(XP0,XP1,YP0,YP1);$ $XP0=XOR(H4,Xe,X0,X2,X4,X6,\ldots,X78,FNH);$ $XP1=XOR(H2,H6,Xo,X1,X3,X5,X7,\ldots,X79,EV);$ $YP0=XOR(H5,Ye,Y0,Y2,Y4,Y6,\ldots,Y78);$ and $YP1=XOR(H3,H7,Yo,Y1,Y3,Y5,Y7,\ldots,Y79).$ Each parity check logic circuit in the illustrated CAM core 16 of FIG. 5B generates two parity result bits. One of these is for the left side CAM array within a corresponding CAM array block and the other of these is for the right side CAM array within the corresponding CAM array block. Different CAM array blocks having only one or more than two CAM arrays therein can be used to generate a different number of parity result bits. Moreover, in alternative embodiments, the parallel read operation may cause only one entry to be read from either the left side CAM array or right side CAM array within the group of CAM array blocks. In this case, the read address accompanying the parallel read operation may specify either the right CAM array or left CAM array, along with a row address. Nonetheless, two parity result bits may be generated for each left or right entry. These two bits of parity result may be computed as:

$PARITY\ RESULT=(OR(XP0,XP1),OR(YP0,YP1)).$

In this manner, the two bits of parity result that are generated from an entry will indicate whether the error is in the X bits, Y bits, or both X and Y bits. This indication of X bit or Y bit error may be useful when reporting erroneous entries to the command host.

Figure 5C:
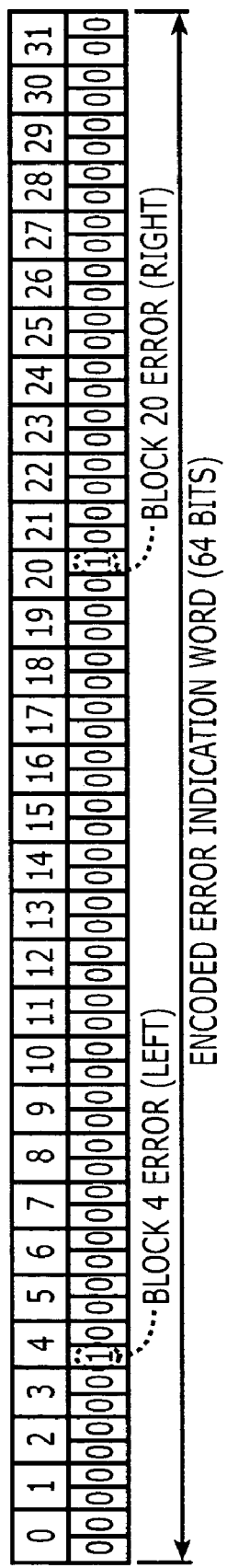
FIG. 5C illustrates the arrangement of data within an encoded error indication word that may be generated by the CAM core of FIG. 5B when an error check instruction is issued to the CAM core.

As illustrated by FIGS. 5B-5C, these parity result bits are encoded into a 64-bit error indication word, which is passed to a read data port of the CAM core 16. This eliminates the need to pass all 64 entries in sequence across the read data port. The encoded error indication word of FIG. 5C, which is provided as an example, indicates the presence of parity errors in two entries within the 32 CAM array blocks (from the designated row address). These entries include an entry from the left side of CAM block 4 and an entry from the right side of CAM block 20. Alternatively, in the event two bits of parity result are generated from an entry undergoing parity checking, then the encoded error indication word of FIG. 5C may indicate an X-bit error in an entry from CAM block 4 and a Y-bit error in an entry from CAM block 20.

Figure 5D:
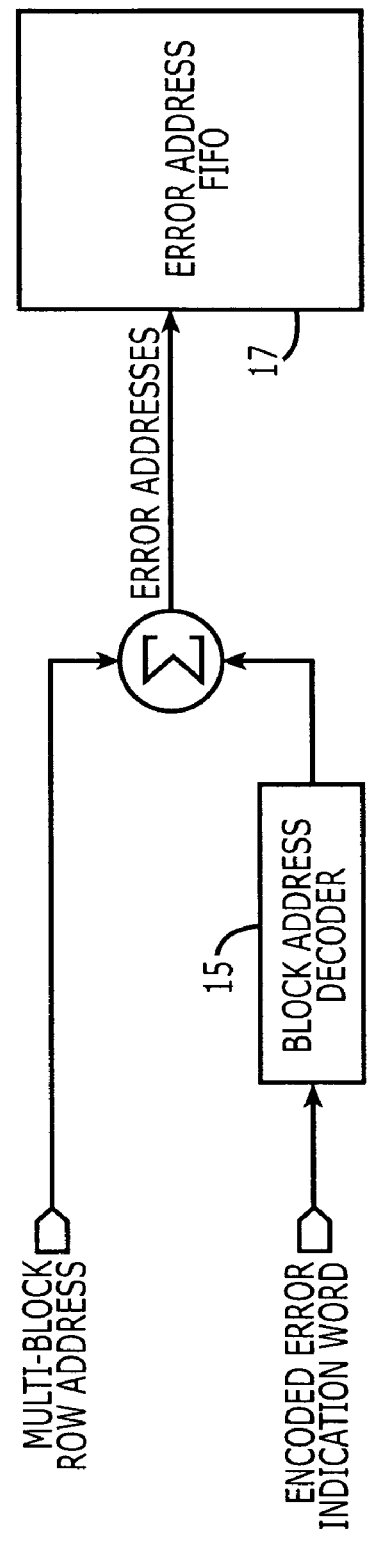
FIG. 5D is a block diagram of circuit elements within an error correction logic circuit, according to embodiments of the present invention.

Referring again to FIG. 3, this encoded error indication word is passed to the result module 18 and then fed back to the instruction execution module 14 where it is decoded. As illustrated by FIG. 5D, which illustrates a portion of the logic within the instruction execution module 14, the encoded error indication word is received by a block address decoder 15. This block address decoder looks for active bits within the encoded error indication word and generates the block addresses of the CAM array blocks having erroneous entries therein. In the illustrated embodiment, these block addresses may include an array address, which identifies whether a left or right CAM array within a block contains an erroneous entry. These addresses are combined with the multi-block row address that was previously generated when the parity check instruction was issued by the instruction execution module 14, to thereby generate a row address of each erroneous entry within a corresponding CAM array (left or right). These row addresses are stored within an error address memory device 17, which is illustrated as a FIFO memory device. As described more fully hereinbelow, this FIFO memory device may be a searchable memory device that can be used to prevent conflicts when write operations are performed to addresses containing erroneous entries. Alternatively, the encoded error indication word may be stored in a register (not shown) and then checked and updated for the presence of any remaining erroneous addresses. (See, e.g., Block 606 in FIG. 6, where the check of an error address FIFO may be replaced by a check of the register).

The error detection and correction operations 600 performed by the search engine device 10 of FIGS. 3-4 and 5A-5D include a check by the instruction execution module 14 to determine whether an incoming instruction pipeline has an opening therein that can support the insertion of a CAM core instruction. This check is made at Block 602 in FIG. 6. When this check results in an affirmative answer, control is passed to Block 604. At Block 604, a check is made to determine whether any corrected entry is pending in the instruction execution module for insertion into the CAM core 16. If this check results in a negative answer, control is passed to Block 606. At Block 606, a check is made as to whether the error address FIFO 17 within the instruction execution module is empty. If this check results in an affirmative answer, then a multi-block row address counter (not shown) within the instruction execution module 14, is incremented, Block 608. Upon reset of the search engine device, this counter may be reset to a zero count.

As illustrated by Block 610, a parity check instruction and the counter value (row address) are forwarded to the CAM core 16. In response to this parity check instruction, a plurality of entries are read in parallel from the CAM array blocks into the parity check logic that is embedded within the CAM core 16, Block 612. In the embodiments described above, this parity check read operation results in the parallel transfer of 64 entries 21 into the parity check logic. (See, e.g., FIG. 5B). At Block 614, the plurality of entries are checked for parity errors and the parity results are passed as an encoded error indication word to the read data port. The encoded error indication word is then forwarded from the result module 18 to the instruction execution module, Block 616.

If the error indication word indicates the presence of one or more parity errors when it is initially processed by the block address decoder 15, Block 618, then it is decoded into one or more corresponding addresses. The addresses of the erroneous entries are then added to the error address FIFO 17, Block 620, and control is returned to Block 602. If the error indication word does not indicate at least one error at Block 618, then control is returned directly to Block 602 without any further processing of the error indication word.

Once control is returned to Block 602 and an opening in the instruction pipeline is detected, a check is made to determine whether there are any corrected entries pending in the instruction execution module, Block 604. If the answer is no, then a check is made at Block 606 to determine whether the error address FIFO 17 is empty. Assuming the two entry errors illustrated by FIG. 5C were detected when Block 618 was originally encountered, then this check at Block 606 will result in a negative conclusion and control will be passed to Block 622. At Block 622, the next available error address within error address FIFO 17 is designated as the current error address. This error address and read instruction are then passed to the CAM core, Block 624. At Block 626, the previously detected erroneous entry is read from the selected CAM array block and passed to the read data port of the CAM core 16. In some embodiments, this read instruction may constitute a "read-set-invalid" instruction that results in a read of the entry and simultaneously causes the valid bit in the entry to be set to an invalid value. This will remove the invalid entry from the search path within the CAM core 16 until it is subsequently corrected and rewritten. Alternatively, the read instruction may be treated as a multi-cycle instruction, which includes a set-invalid operation to invalidate the entry and then a subsequent read operation to read the erroneous entry and pass it to the read port. The performance of the set-invalid operation before the read operation operates to remove the erroneous entry from the search path as soon as practical.

The erroneous entry is then forwarded by the result module 18 to the instruction execution module 14, Block 628. At Block 630, the erroneous entry is further evaluated for the presence of errors and corrected by the error correction logic within the instruction execution module 14, if possible. If correction is not possible (e.g., because of the presence of a multi-bit error), then this condition and possibly the error address are communicated to a host processor, which may undertake to replace the defective entry. These error correction operations identified by Block 630 may be performed as background operations without impacting the compare bandwidth of the search engine device 10.

Thereafter, the corrected entry is stored in a buffer memory (not shown) in the instruction execution logic 14 pending rewriting into the CAM core 16. As described above, the four bits of parity associated with each entry in the CAM core 16 support the detection of as many as four parity errors. Each of these parity bits, Xe, Ye, Xo and Yo, is a function of the data bits and at least some of the Hamming code bits H2-H7. For example, the parity bit Xe is a function of the even X bits, the FNH bit and Hamming code bit H4, as illustrated above. The parity bit Yo is a function of the odd Y bits and Hamming code bits H3 and H7. The functions performed by the parity bits and Hamming code bits may also be combined as a check word to support the correction of a single bit error within the entry. If desired, a greater number of check bits can be used in some embodiments to support correction of a greater number of errors. In the event the parity checking operation indicates the presence of two or as many as four errors within the entry 21 that cannot be corrected, then the entry 21 and its address within the CAM core 16 may be reported to the command host for further processing and the entry 21 may be invalidated within the CAM core 16. These reporting operations may also apply to erroneous entries that are subject to correction. These reporting operations may be facilitated by the use of an error FIFO that retains the erroneous entries and/or their addresses. This error FIFO may be subject to periodic reading operations by the command host.

After the operations of Block 630, control is passed back to Blocks 602 and 604. Accordingly, upon detection of an opening (e.g., no-op cycle) within the instruction pipeline, the check of whether a corrected entry is pending results in an affirmative answer, Block 604, and control is passed to Block 632. The corrected entry, corresponding address and a write instruction are then passed to the CAM core 16. In response, the corrected entry is written over the corresponding erroneous entry in the designated CAM array block, Block 634. Operations (not shown) may also be performed to compare each incoming write address (e.g., those issued by a command host) against the entries of the error address FIFO 17 to detect a match. If a match is present, the externally generated write instruction is submitted to the CAM core 16 and the matching address within the error address FIFO 17 is removed so that no overwrite operation to correct an "erroneous" entry is performed on a newly written entry. In this manner, the error address FIFO 17 operates as a searchable cache memory. Similar compare operations may also be performed with respect to an incoming read address. In the event a match is detected, the corresponding read operation may be suspended until such time as the erroneous entry has been corrected. Alternatively, the read operation may be marked so that any read result will be accompanied by a flag or other indication that the entry is erroneous.

Figure 6:
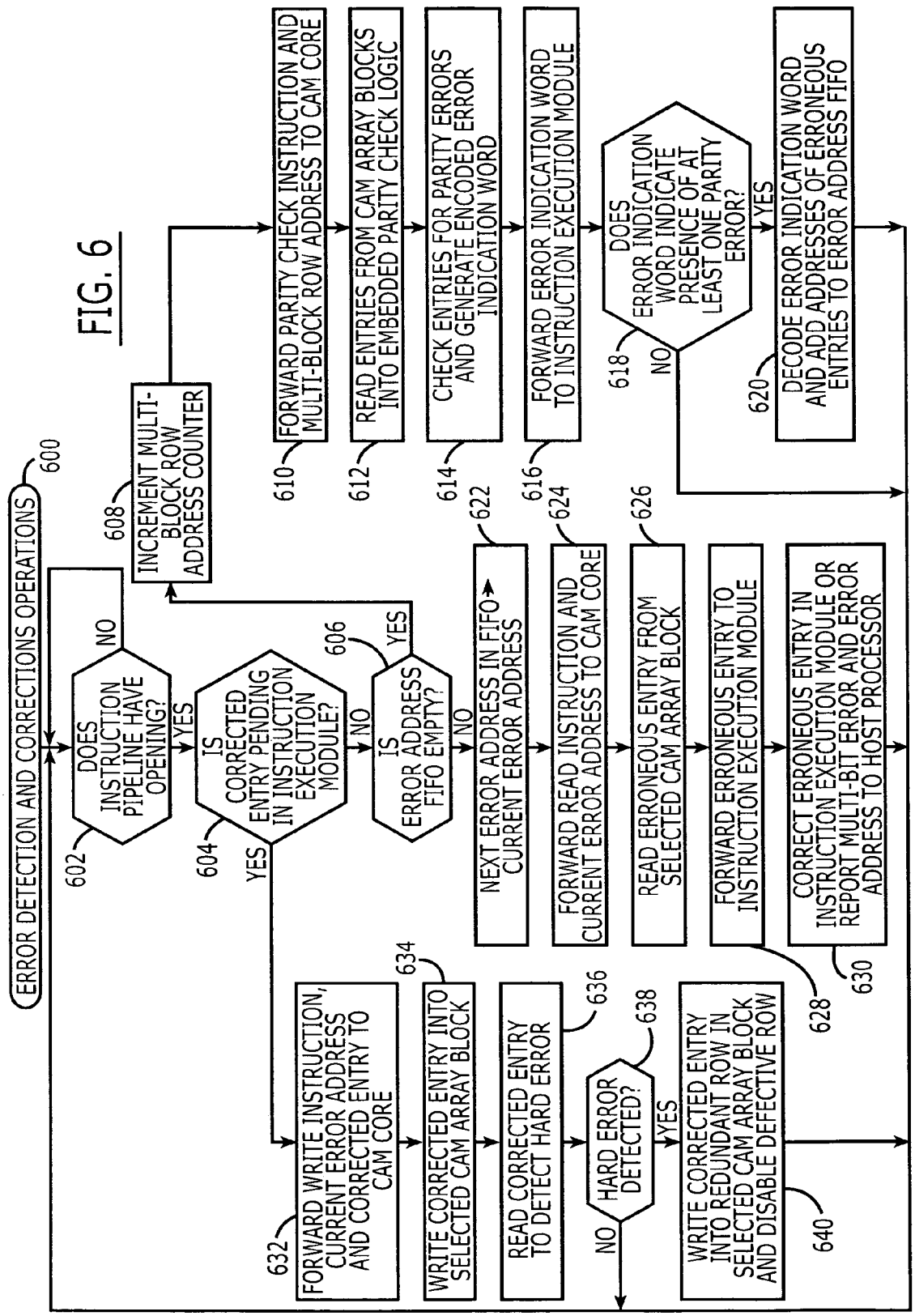
FIG. 6 is a flow diagram of operations that illustrate methods of performing error detection and correction operations within a search engine device, according to embodiments of the present invention.

Upon completion of the write operation illustrated by Block 634, a check can be made to confirm whether the newly written "corrected" entry is again erroneous because of the presence of a hard error in the entry, Blocks 636 and 638. This check can be performed by reading and passing the newly written "corrected" entry to the result module 18 and then to the instruction execution module 14 for further error checking and, if necessary, error correction. If the instruction execution module 14 detects the presence of a "hard" error in the entry, then the entry is again corrected and written into a redundant row in the selected CAM array block. The defective row of CAM cells containing the hard error is then disabled and removed from the search path, Block 640. The current error address of the "corrected" entry is also removed from the error address FIFO 17 before control is passed to Block 602 and the sequence of operations illustrated by FIG. 6 is repeated. In particular, control is again passed through Blocks 602, 604 and 606 and the next error address in the FIFO is set as the current error address, Block 622. The operations associated with Blocks 624-630 are then performed. If the error address FIFO is empty, Block 606, then control is passed to Block 608 where the multi-block row address counter is incremented before performing the next parity check operation and repeating the above described operations in sequence for all of the rows (e.g., 2048 rows in FIG. 4A) within the CAM array blocks.

The operations illustrated by FIG. 6 reflect an embodiment of CAM maintenance operations, whereby soft errors are automatically detected and corrected and some hard errors are detected and corrected using, among other things, built-in self repair (BISR) techniques supported by row redundancy. Other BISR techniques may also be used to correct hard errors. However, as will now be described with respect to FIGS. 3 and 7, the control circuits described herein may be further configured to perform extensive background maintenance operations (e.g., built-in self test (BIST) and built-in self repair (BISR)) concurrently with foreground search operations.

Figure 7:
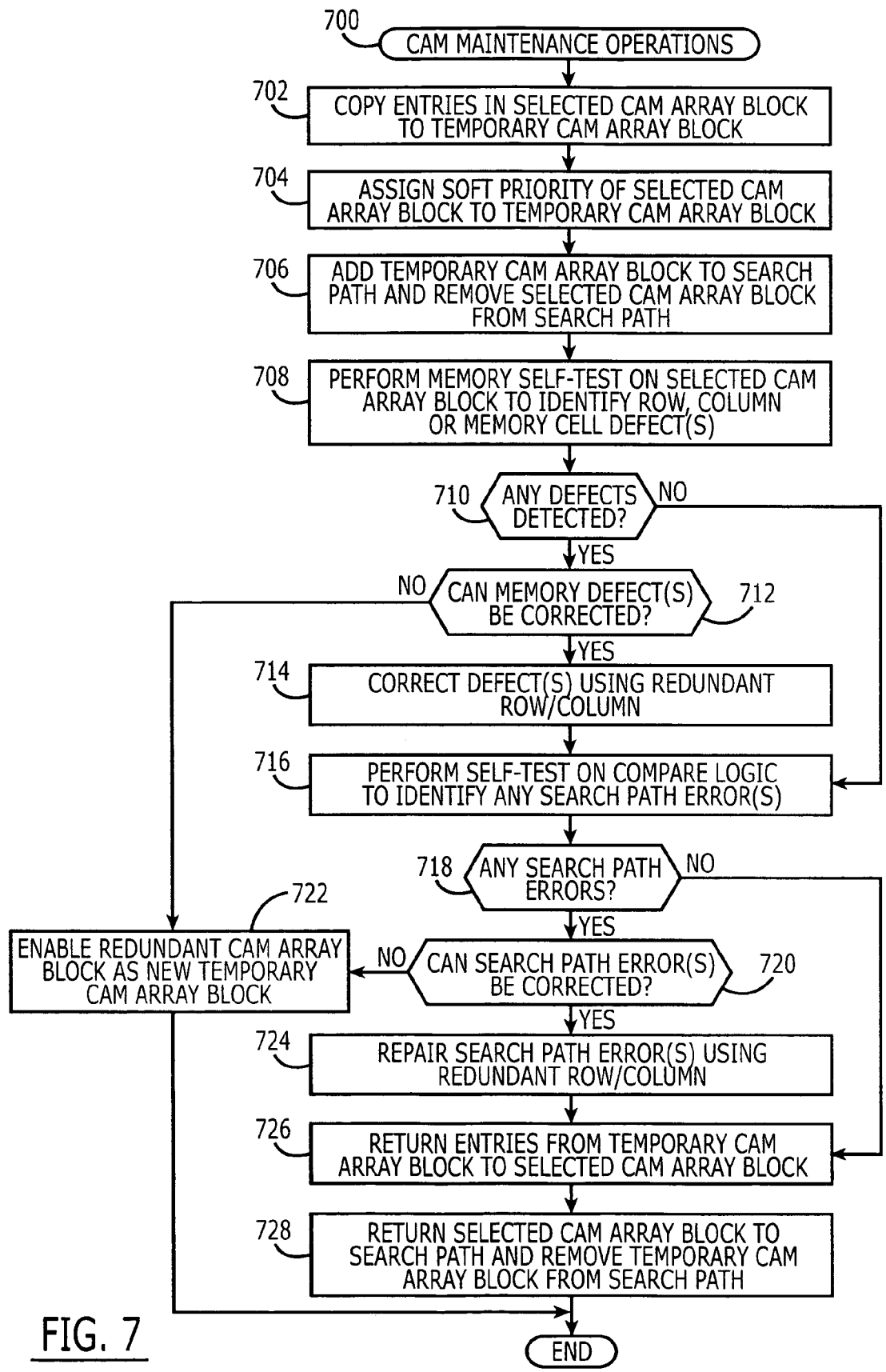
FIG. 7 is a flow diagram of CAM maintenance operations according to embodiments of the present invention.

In particular, FIG. 7 illustrates additional CAM maintenance operations 700 performed by the control circuitry described herein. This control circuitry, which may surround and extend within the CAM core 16, is electrically coupled to the plurality of CAM array blocks (shown as CAM BLOCK 0-CAM BLOCK 31). This control circuitry is configured to perform built-in self repair of memory and/or compare logic defects in the plurality of CAM array blocks concurrently with operations to search entries within the CAM core 16 so that the search bandwidth (a/k/a compare bandwidth) of the search engine device 10 is not reduced by the performance of the CAM maintenance operations 700. The control circuitry is also configured to perform built-in self repair of memory and/or compare logic defects in the plurality of CAM array blocks concurrently with operations to write entries into the CAM core 16. In particular, if an entry is to be written into an addressed block while it is undergoing test and possibly repair operations, the entry may be written into a temporary buffer and then subsequently transferred to the addressed block after it has undergone test and repair. Operations performed by the control circuitry described herein may also be applied to other types of memory devices, including SRAM and DRAM devices, for example.

These CAM maintenance operations 700, which may be performed in a sequential manner through each of the CAM array blocks at a programmed maintenance frequency, include copying all entries in a selected CAM array block (e.g., CAM Block 0) to a "temporary" CAM array block (e.g., CAM Block 28) that is used to support the maintenance operations, Block 702. These copying operations may be performed concurrently with search operations within the selected CAM array block. The previously assigned soft priority of the selected CAM array block (e.g., CAM Block 0) is also assigned to the temporary CAM array block, Block 704. This assignment of soft priority is performed so that all the entries in the temporary CAM array block have the appropriate priority when these entries are searched. The use of soft priority assignments to facilitate search operations and more flexible priority resolution of match signals is described more fully in commonly assigned U.S. application Ser. Nos. 10/263,223 and 10/263,258, filed Oct. 2, 2002, and U.S. application Ser. No. 10/613,542, filed Jul. 3, 2003, the disclosures of which are hereby incorporated herein by reference.

Upon completion of the entry copying and priority assignment operations, the selected CAM array block is removed from the search path of the search engine device 10 and the temporary CAM array block is added to the search path, Block 706. These operations essentially take the selected CAM array block "off-line" so that background BIST operations and BISR operations, if necessary, can be performed on the selected CAM array block without interrupting operations to search the entries originally stored in the selected CAM array block, but which have been transferred to the temporary CAM array block. Thereafter, as illustrated by Block 708, background BIST operations are performed on the selected CAM array block (now off-line with respect to search operations) to identify the presence of any row, column or memory cell defects therein. These BIST operations may use conventional test algorithms that are well known to those skilled in the art. If at least one defect is detected, Block 710, a check is made to determine whether the detected defect(s) can be corrected using a BISR technique, Block 712. If not, control is passed to Block 722. Otherwise, the defect is corrected using a redundant row or column of CAM cells within the selected CAM array block, Block 714. Techniques for correcting memory cell defects using redundant rows or columns of memory cells are known to those skilled in the art and need not be described further herein. Referring now to Blocks 716 and 718, a BIST operation is then performed on the compare logic within the selected CAM array block to identify the presence of any search path errors therein (e.g., the presence of any defects relating to the compare logic within each CAM cell). If the detected search path error(s) can be corrected, Block 720, then it is repaired, Block 724.

The correction of all detected memory and search path defects within the selected CAM array block, if any, prepares the selected CAM array block for return to the search path of the search engine device 10. At Block 726, the entries from the temporary CAM array block are copied back to the selected CAM array block and then the selected CAM array block is added to the search path, Block 728. Alternatively, if either the decision at Block 712 or Block 720 is negative, then the temporary CAM array block remains in the search path of the search engine device 10 and an unused "redundant" CAM array block (e.g., CAM Block 29) is established by the control circuitry (e.g., CAM core logic) as the new temporary CAM array block for purposes of performing background error detection and correction, Block 722. The CAM maintenance operations 700 are then repeated on the next active CAM array block within the CAM core 16.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated search engine device, comprising:
   a content addressable memory (CAM) core having a plurality of CAM array blocks therein; and
   a control circuit electrically coupled to the plurality of CAM array blocks, said control circuit configured to perform built-in self repair of hard memory and/or compare logic defects in the plurality of CAM array blocks concurrently with operations to search entries in the plurality of CAM array blocks.

2. The search engine device of claim 1, wherein said control circuit is further configured to repair a hard memory error and/or a compare logic defect in a first one of the plurality of CAM array blocks concurrently with searching entries associated with the first one of the plurality of CAM array blocks.

3. The search engine device of claim 1, wherein said control circuit is further configured to repair a hard memory error and/or a compare logic defect in a first one of the plurality of CAM array blocks using a redundant row and/or redundant column of CAM cells, concurrently with searching entries associated with the first one of the plurality of CAM array blocks.

4. The search engine device of claim 1, wherein said control circuit is further configured to repair a hard memory error and/or a compare logic defect in a first row within a first one of the plurality of CAM array blocks using a redundant row and/or redundant column of CAM cells in the first one of the plurality of CAM array blocks, concurrently with searching an entry associated with the first row.

5. An integrated search engine device, comprising:
   a content addressable memory (CAM) core having a plurality of CAM array blocks therein; and
   a control circuit electrically coupled to the plurality of CAM array blocks, said control circuit configured to perform built-in self repair of compare logic defects in a first one of the plurality of CAM array blocks concurrently with operations to search entries in the plurality of CAM array blocks.

6. An integrated search engine device, comprising:
   a content addressable memory (CAM) core having a plurality of CAM array blocks therein; and
   a control circuit electrically coupled to the plurality of CAM array blocks, said control circuit configured to perform memory and compare logic self-tests on at least a selected one of the plurality of CAM array blocks during a CAM maintenance operation that is performed concurrently with operations to search entries copied from the selected one of the plurality of CAM array blocks.

7. The search engine device of claim 6, wherein said control circuit is further configured to repair at least one hard memory defect and/or at least one compare logic defect in the selected one of the plurality of CAM array blocks concurrently with the operations to search entries copied from the selected one of the plurality of CAM array blocks.

8. An integrated circuit chip, comprising:
   a search engine device configured to support built-in self test (BIST) and built-in self repair (BISR) of hard memory errors therein as background operations that are performed concurrently with foreground search operations.

* * * * *

UNITED STATES PATENT AND TRADEMARK OFFICE
CERTIFICATE OF CORRECTION

| | |
|---|---|
| PATENT NO. | : 7,304,875 B1 |
| APPLICATION NO. | : 11/184414 |
| DATED | : December 4, 2007 |
| INVENTOR(S) | : Lien et al. |

Page 1 of 1

It is certified that error appears in the above-identified patent and that said Letters Patent is hereby corrected as shown below:

On Title Page:

(*) Notice: Please delete "This patent is subject to a terminal disclaimer."

Signed and Sealed this

Second Day of June, 2009

JOHN DOLL
*Acting Director of the United States Patent and Trademark Office*